United States Patent
Yue et al.

(10) Patent No.: US 6,893,975 B1
(45) Date of Patent: May 17, 2005

(54) SYSTEM AND METHOD FOR ETCHING A MASK

(75) Inventors: Hongyu Yue, Austin, TX (US); Asao Yamashita, Wappingers Falls, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/813,570

(22) Filed: Mar. 31, 2004

(51) Int. Cl.[7] .................................... H01L 21/302
(52) U.S. Cl. ...................................... 438/714
(58) Field of Search .......................... 438/706–712, 438/714, 734, 739

(56) References Cited

U.S. PATENT DOCUMENTS 6,235,609 B1 * 5/2001 Sengupta et al. .......... 438/424
6,716,570 B2 * 4/2004 Nagarajan et al. ......... 430/311

* cited by examiner

*Primary Examiner*—Matthew Smith
*Assistant Examiner*—Calvin Lee
(74) *Attorney, Agent, or Firm*—Pillsbury Winthrop Shaw Pittman LLP

(57) ABSTRACT

A system and method for transferring a pattern from an overlying layer into an underlying layer, while laterally trimming a feature present within the pattern is described. The pattern transfer is performed using an etch process according to a process recipe, wherein at least one variable parameter within the process recipe is adjusted given a target trim amount. The adjustment of the variable parameter is achieved using a process model established for relating trim amount data with the variable parameter.

17 Claims, 15 Drawing Sheets

SYSTEM AND METHOD FOR ETCHING A MASK

FIELD OF THE INVENTION

The present invention relates to a system and method for etching a mask and, in particular, to a system and method for transferring a pattern from an overlying layer into the mask layer while laterally trimming the pattern in the mask by means of etching.

BACKGROUND OF THE INVENTION

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry.

Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, gates, etc.) in the selected regions of the substrate. Such substrate materials where etching is required include silicon dioxide ($SiO_2$), low-k dielectric materials, poly-silicon, and silicon nitride.

During material processing, etching such features generally comprises the transfer of a pattern formed within an overlying layer to the underlying layer within which the respective features are formed. The overlying layer can, for example, comprise a light-sensitive material such as (negative or positive) photo-resist. Once the pattern is transferred from the overlying layer into the underlying layer, the underlying, either by itself or with the overlying layer, can serve as a mask for etching underlying films.

SUMMARY OF THE INVENTION

In one aspect of the invention, a method for performing a one-step mask open process comprises: forming a first layer on a substrate; forming a second layer on the first layer; forming a pattern in the second layer, wherein the pattern includes a feature in the second layer having a first critical dimension; setting a target trim amount for reducing the first critical dimension to a second critical dimension; determining a variable parameter for a process recipe using the target trim amount and a process model relating trim amount data to the variable parameter; and transferring the pattern from the second layer to the first layer using the process recipe, while achieving the second critical dimension of the feature in the first layer.

In another aspect of the invention, a method of preparing a process model comprises: defining a nominal process recipe for transferring a pattern having a first feature size from an overlying layer to an underlying layer on a substrate, wherein the nominal process recipe comprises a variable process parameter and at least one constant process parameter; accumulating trim amount data as a function of the variable parameter by measuring the trim amount for one or more values of the variable parameter; and curve-fitting the trim amount data as a function of the variable parameter.

In yet another aspect of the invention, an etching system comprises: a process chamber, a substrate holder coupled to the process chamber, and configured to support a substrate; a plasma source coupled to the process chamber, and configured to form plasma in the process chamber; a gas injection system coupled to the process chamber, and configured to introduce a process gas to the process chamber; and a controller coupled to at least one of the process chamber, the substrate holder, the plasma source, and the gas injection system, and configured to execute a process recipe in order to transfer a pattern having a feature with a first critical dimension in an overlying layer to an underlying layer on the substrate, while reducing the first critical dimension to a second critical dimension by a target trim amount set by a process model.

DETAILED DESCRIPTION OF SEVERAL EMBODIMENTS

In material processing methodologies, pattern etching comprises the application of a thin layer of light-sensitive material, such as photoresist, to an upper surface of a substrate, that is subsequently patterned in order to provide a mask for transferring this pattern to the underlying thin film during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent.

Additionally, multi-layer masks can be implemented for etching features in a thin film. For example, when etching features in a thin film using a bilayer mask, the mask pattern in the overlying mask layer, such as the layer of light-sensitive material, is transferred to the underlying mask layer using a separate etch step preceding the main etch step for the thin film. For example, the underlying mask layer can include an organic thin film, such as an organic anti-reflective coating (ARC, or bottom ARC (BARC)), an inorganic thin film, or a hybrid organic-inorganic thin film.

Figure 1A:
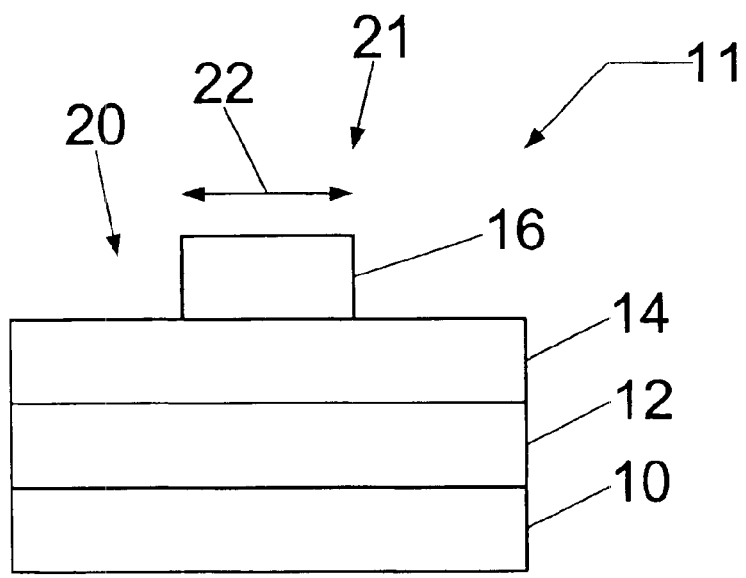
FIGS. 1A and 1B illustrate a schematic representation of a film stack.

In order to reduce the feature size formed in the thin film, the underlying mask layer can be trimmed laterally, while the mask pattern formed in the overlying mask layer is transferred into the underlying mask layer. For instance, FIG. 1A illustrates a film stack 11 comprising a substrate 10 having a thin film 12 deposited thereon. The film stack 11 further includes a first layer 14 formed on the thin film 12, followed by a second layer 16 formed on the first layer 14. The first layer 14 and the second layer 16 can be formed using spin-on deposition (SOD) techniques, and/or vapor deposition techniques, such as chemical vapor deposition (CVD). Both techniques are well known to those skilled in the art of material deposition.

The second layer 16 can include a layer of light-sensitive material, such as photoresist. The second layer 16 can be formed using a track system. The track system can be configured for processing 248 nm resists, 193 nm resists, 157 nm resists, EUV resists, (top/bottom) anti-reflective coatings (TARC/BARC), and top coats. For example, the track system can comprise a Clean Track ACT 8, or ACT 12 resist coating and developing system commercially available from Tokyo Electron Limited (TEL). Other systems and methods for forming a photoresist film on a substrate are well known to those skilled in the art of spin-on resist technology. Once the second layer 16 is formed, a pattern 20 can be formed in the second layer 16 using micro-lithography. After developing the irradiated (exposed) second layer 16, a feature 21 remains having a first critical dimension (CD) 22, as indicated in FIG. 1A.

Figure 1B:
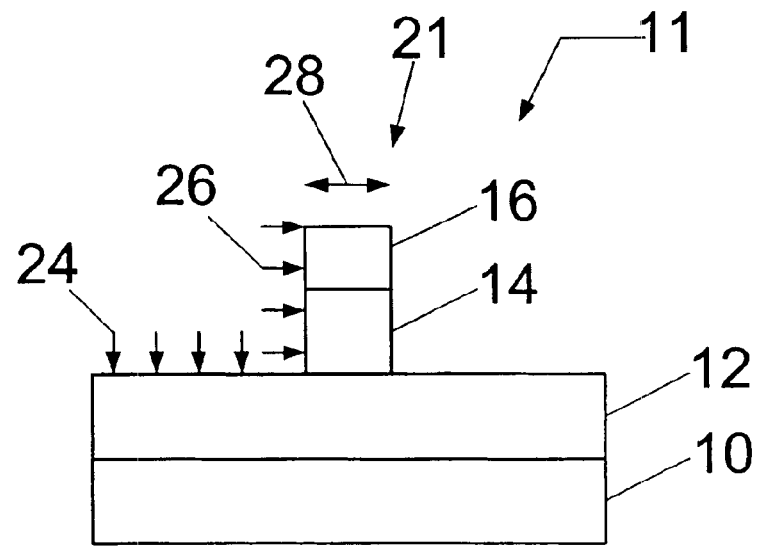

Referring now to FIG. 1B, the pattern 20 is transferred to the first layer 14 by etching, such as dry plasma etching. During the etching process, longitudinal etching (as indicated by reference numeral 24) completes the pattern transfer, and lateral etching (as indicated by reference numeral 26) trims the feature 21 in the lateral dimension such that the first critical dimension 22 becomes a second critical dimension 28.

The etch process for performing both the longitudinal and lateral etching comprises a one-step process. The process chemistry for the one-step chemistry includes a $C_xF_y$ containing gas (wherein x, y are integers greater than or equal to unity), and an oxygen containing gas. For example, the $C_xF_y$ containing gas can include $CF_4$, $C_2F_6$, $C_3F_6$, $C_4F_6$, $C_4F_8$, or $C_5F_8$ or any combination of two or more thereof. Additionally, for example, the oxygen containing gas can include $O_2$, $CO$, $CO_2$, $NO$, $NO_2$, or $N_2O$, or any combination of two or more thereof. Optionally, the one-step process chemistry can further include an inert gas, such as a Noble gas (e.g., He, Ar, Kr, Xe, or Ne, or any combination of two or more thereof), and/or $N_2$.

Figure 2:
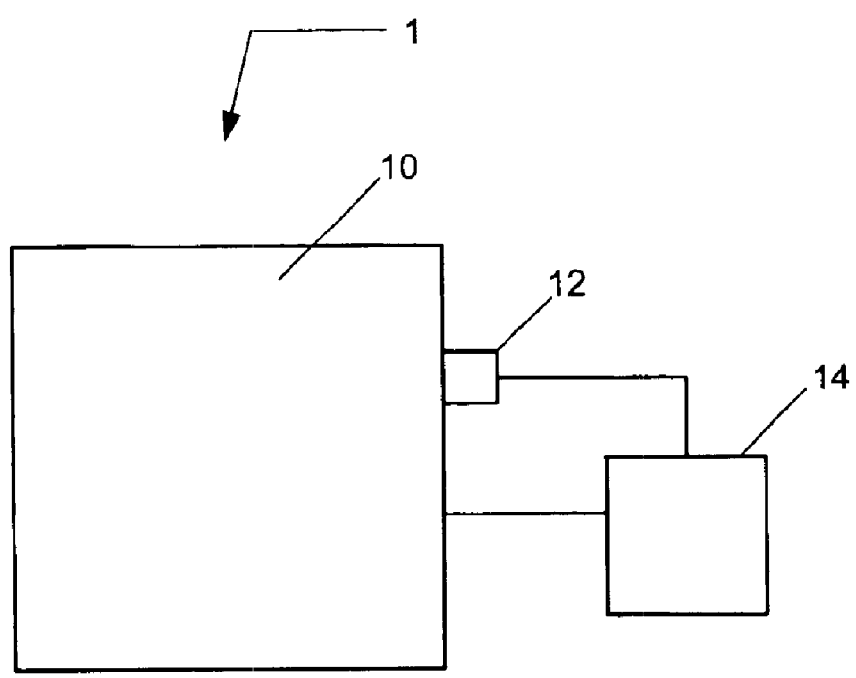
FIG. 2 shows a simplified schematic diagram of a plasma processing system according to an embodiment of the invention.

According to one embodiment, a plasma processing system 1 for performing the one-step etch process is depicted in FIG. 2 comprising a plasma processing chamber 10, a diagnostic system 12 coupled to the plasma processing chamber 10, and a controller 14 coupled to the diagnostic system 12 and the plasma processing chamber 10. The controller 14 is configured to execute a process recipe comprising at least one of the above-identified chemistries (i.e. $C_xF_y$ containing gas, and oxygen containing gas, etc.) to etch the first mask layer. Additionally, controller 14 is configured to receive at least one endpoint signal from the diagnostic system 12 and to post-process the at least one endpoint signal in order to accurately determine an endpoint for the process. In the illustrated embodiment, plasma processing system 1, depicted in FIG. 2, utilizes a plasma for material processing. Plasma processing system 1 includes an etch chamber.

Figure 3:
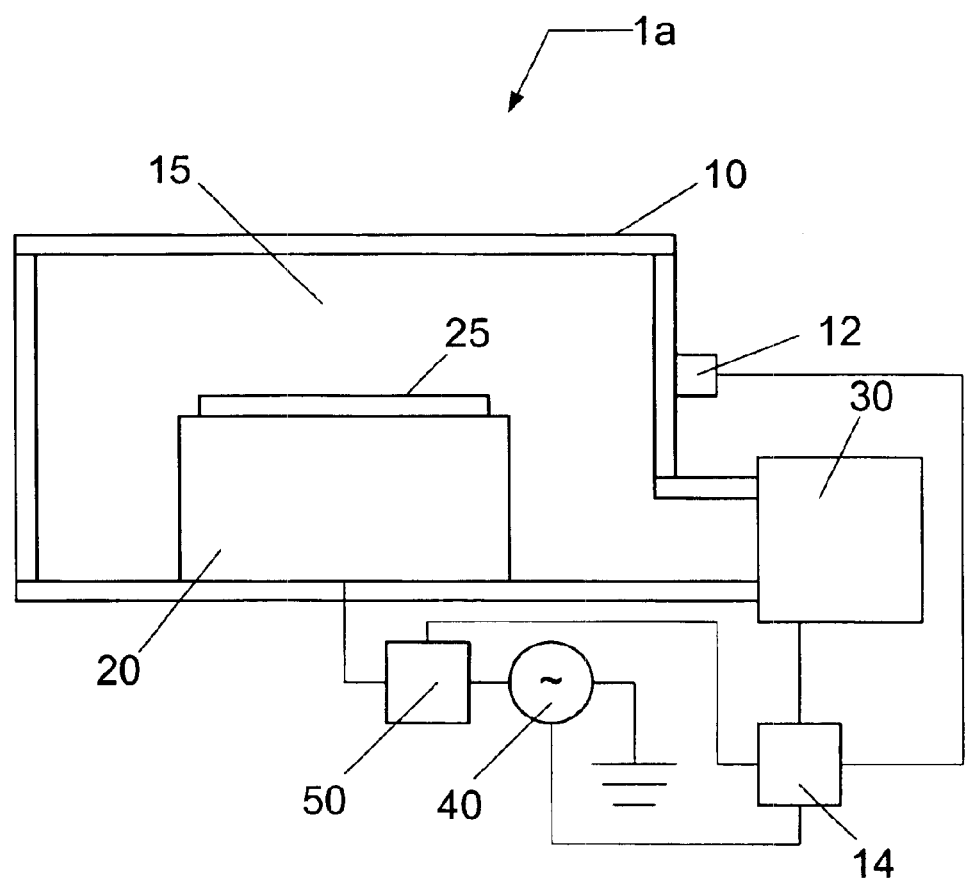
FIG. 3 shows a schematic diagram of a plasma processing system according to another embodiment of the invention.

According to the embodiment depicted in FIG. 3, plasma processing system 1a can comprise plasma processing chamber 10, substrate holder 20, upon which a substrate 25 to be processed is affixed, and vacuum pumping system 30. Substrate 25 can be, for example, a semiconductor substrate, a wafer or a liquid crystal display. Plasma processing chamber 10 can be, for example, configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process 200 mm substrates, 300 mm substrates, or substrates of any size.

Substrate 25 can be, for example, affixed to the substrate holder 20 via an electrostatic clamping system. Furthermore, substrate holder 20 can, for example, further include a cooling system including a re-circulating coolant flow that receives heat from substrate holder 20 and transfers heat to a heat exchanger system (not shown), or when heating, transfers heat from the heat exchanger system. Moreover, gas can, for example, be delivered to the backside of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the helium gas gap pressure can be independently varied between the center and the edge of substrate 25. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1a.

In the embodiment shown in FIG. 3, substrate holder 20 can comprise an electrode through which RF power is coupled to the processing plasma in process space 15. For example, substrate holder 20 can be electrically biased at a RF voltage via the transmission of RF power from a RF generator 40 through an impedance match network 50 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 50 serves to improve the transfer of RF power to plasma in plasma processing chamber 10 by reducing the reflected power. Match network topologies (e.g. L-type, π-type, T-type, etc.) and automatic control methods are well known to those skilled in the art.

Vacuum pump system 30 can, for example, include a turbo-molecular vacuum pump (TMP) capable of a pumping speed up to about 5000 liters per second (and greater) and a gate valve for throttling the chamber pressure. In conventional plasma processing devices utilized for dry plasma etch, about 1000 to about 3000 liter per second TMP is generally employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 14 comprises a microprocessor, memory, and a digital I/O port capable of generating control voltages sufficient to communicate and activate inputs to plasma processing system 1a as well as monitor outputs from plasma processing system 1a. Moreover, controller 14 can be coupled to and can exchange information with RF generator 40, impedance match network 50, the gas injection system (not shown), vacuum pump system 30, as well as the backside gas delivery system (not shown), the substrate/substrate holder temperature measurement system (not shown), and/or the electrostatic clamping system (not shown). For example, a program stored in the memory can be utilized to activate the inputs to the aforementioned components of plasma processing system 1a according to a process recipe in order to perform the method of etching a mask layer. One example of controller 14 is a DELL PRECISION WORKSTATION 610™, available from Dell Corporation, Austin, Tex.

The diagnostic system 12 can include an optical diagnostic subsystem (not shown). The optical diagnostic subsystem can comprise a detector such as a (silicon) photodiode or a photomultiplier tube (PMT) for measuring the light intensity emitted from the plasma. The diagnostic system 12 can further include an optical filter such as a narrow-band interference filter. In an alternate embodiment, the diagnostic system 12 can include at least one of a line CCD (charge coupled device), a CID (charge injection device) array, and a light dispersing device such as a grating or a prism. Additionally, diagnostic system 12 can include a monochromator (e.g., grating/detector system) for measuring light at a given wavelength, or a spectrometer (e.g., with a rotating grating) for measuring the light spectrum such as, for example, the device described in U.S. Pat. No. 5,888,337.

The diagnostic system 12 can include a high resolution Optical Emission Spectroscopy (OES) sensor such as from Peak Sensor Systems, or Verity Instruments, Inc. Such an OES sensor has a broad spectrum that spans the ultraviolet (UV), visible (VIS), and near infrared (NIR) light spectrums. The resolution is approximately 1.4 Angstroms, that is, the sensor is capable of collecting 5550 wavelengths from 240 to 1000 nm. For example, the OES sensor can be equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

Figure 4:
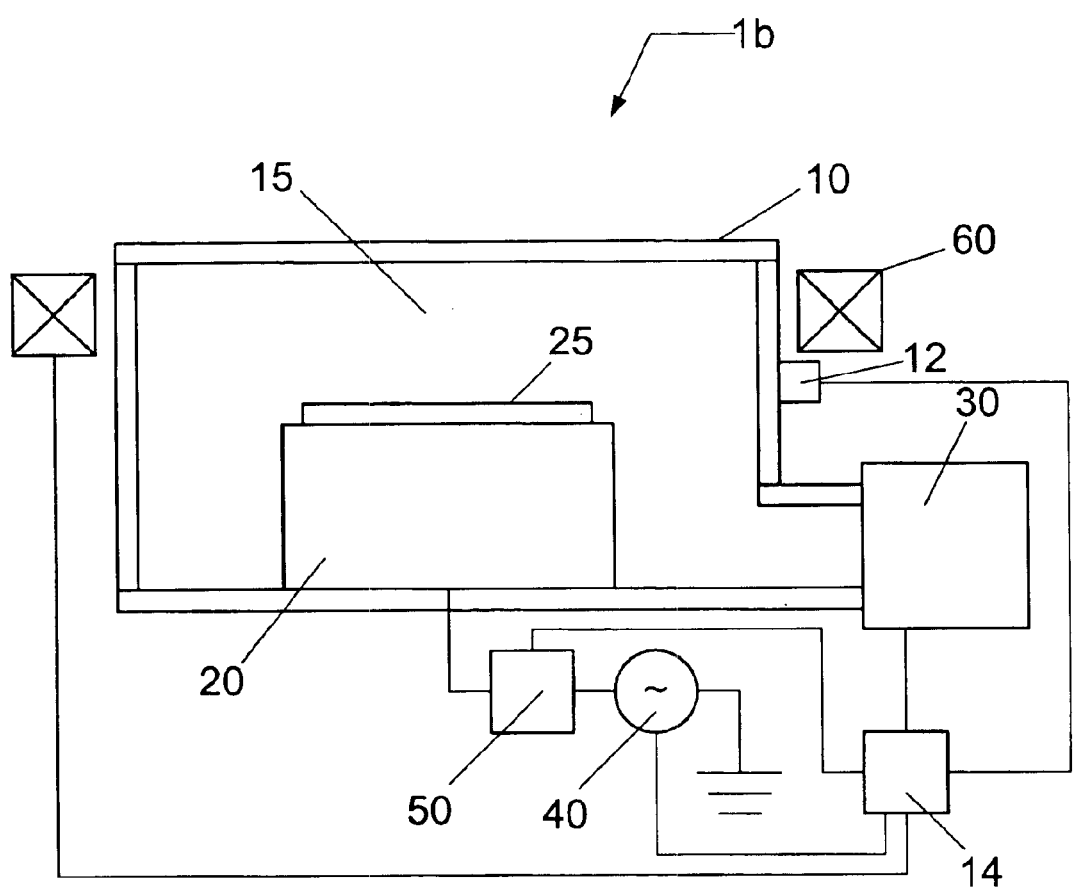
FIG. 4 shows a schematic diagram of a plasma processing system according to another embodiment of the invention.

In the embodiment shown in FIG. 4, the plasma processing system 1b can, for example, be similar to the embodiment of FIG. 2 or 3 and further comprise either a stationary, or mechanically or electrically rotating magnetic field system 60, in order to potentially increase plasma density and/or improve plasma processing uniformity, in addition to those components described with reference to FIG. 2 and FIG. 3. Moreover, controller 14 can be coupled to magnetic field system 60 in order to regulate the speed of rotation and field strength. The design and implementation of a rotating magnetic field is well known to those skilled in the art.

Figure 5:
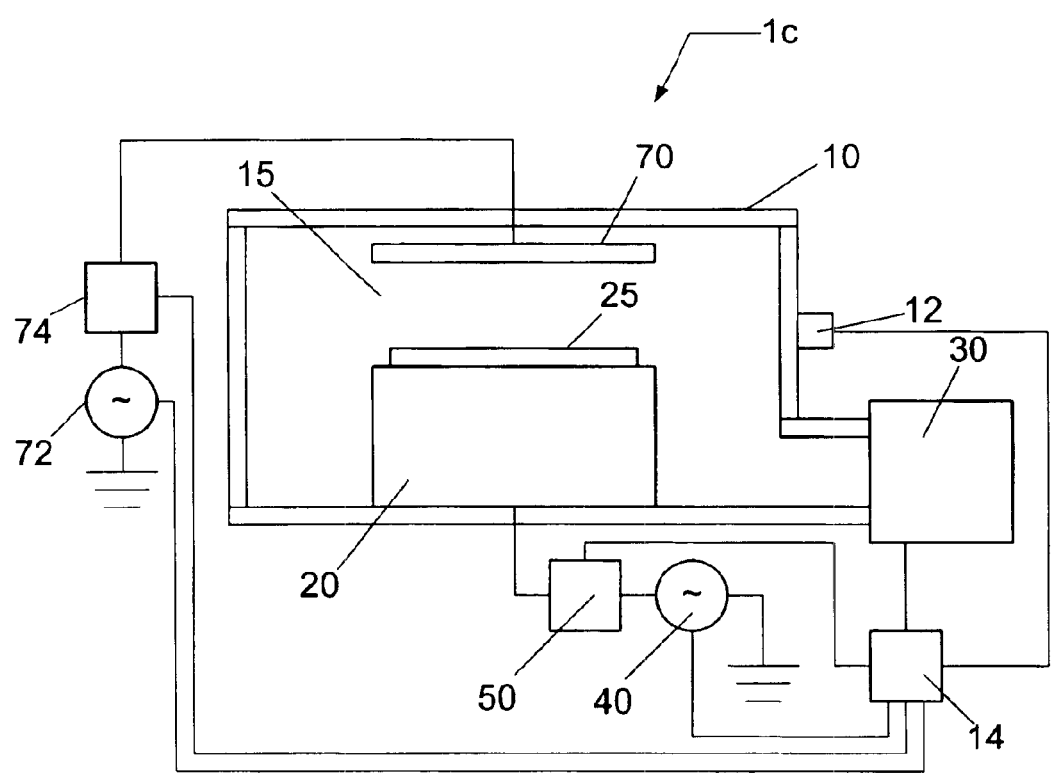
FIG. 5 shows a schematic diagram of a plasma processing system according to another embodiment of the invention.

In the embodiment shown in FIG. 5, the plasma processing system 1c can, for example, be similar to the embodiment of FIG. 2 or FIG. 3, and can further comprise an upper electrode 70 to which RF power can be coupled from RF generator 72 through impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 14 is coupled to RF generator 72 and impedance match network 74 in order to control the application of RF power to upper electrode 70. The design and implementation of an upper electrode is well known to those skilled in the art.

Figure 6:
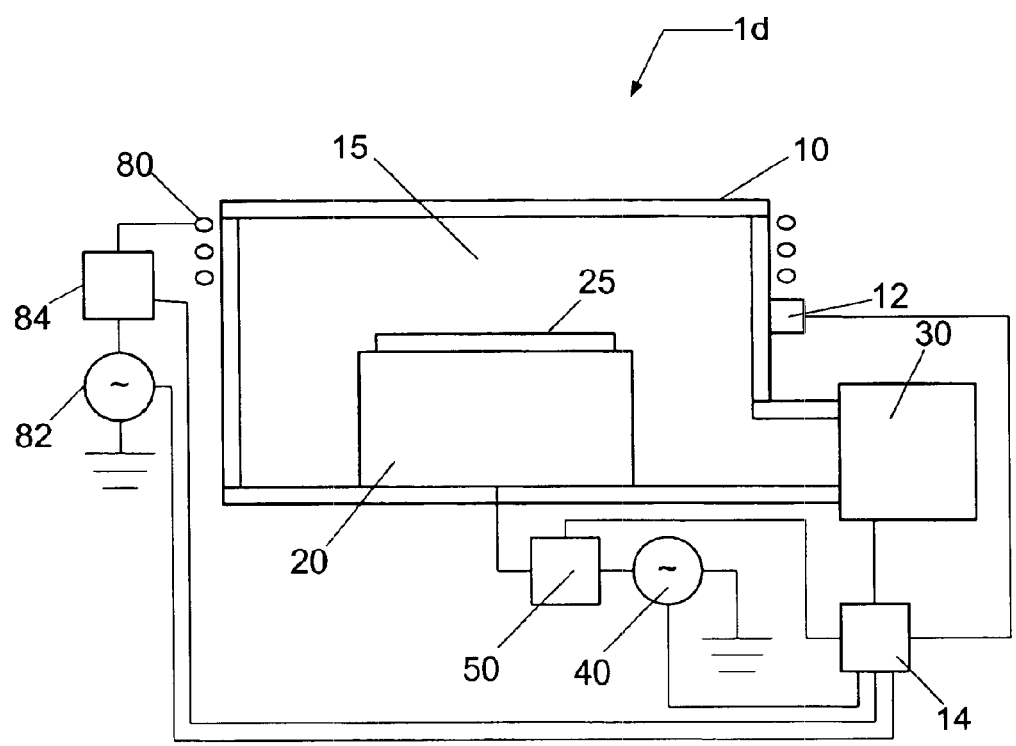
FIG. 6 shows a schematic diagram of a plasma processing system according to another embodiment of the invention.

In the embodiment shown in FIG. 6, the plasma processing system 1d can, for example, be similar to the embodiments of FIGS. 2 and 3, and can further comprise an inductive coil 80 to which RF power is coupled via RF generator 82 through impedance match network 84. RF power is inductively coupled from inductive coil 80 through dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 14 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In one embodiment, a one-step etch process is performed, whereby longitudinal etching completes the transfer of a pattern from a second layer to a first layer, and lateral etching achieves a target critical dimension (CD) for the feature formed following the etch process. For example, the plasma processing device can comprise various elements, such as described in any of FIGS. 2 through 6, or combinations thereof.

In the one embodiment, the method of etching comprises a process chemistry having a $C_xF_y$ containing gas, and an oxygen containing gas. For example, the process chemistry can include $CF_4$ and $O_2$. The process parameter space can comprise a chamber pressure of about 1 to about 1000 mTorr, a $CF_4$ process gas flow rate ranging from about 5 to about 1000 sccm, an $O_2$ process gas flow rate ranging from about 5 to about 1000 sccm, an upper electrode (e.g., element 70 in FIG. 5) RF bias ranging from about 200 to about 2500 W, and a lower electrode (e.g., element 20 in FIG. 5) RF bias ranging from about 10 to about 2500 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz.

In a first example, a process model is prepared in order to form a relationship between a trim amount (e.g., the difference between the first CD 22 and the second CD 28; see FIGS. 1A and 1B), and an amount of gas. For instance, a process recipe is defined, whereby the total process gas flow rate (i.e., $CF_4$ and $O_2$), the chamber pressure, the RF bias on the upper electrode, the RF bias on the lower electrode, the temperature of the substrate holder, and the temperature of the chamber is maintained constant while the $O_2$ ratio is varied. The $O_2$ ratio is the ratio of the amount of $O_2$ (e.g., molar flow rate of $O_2$), to the total amount of process gas (e.g., molar flow rate of $O_2$ and molar flow rate of $CF_4$).

Figure 7:
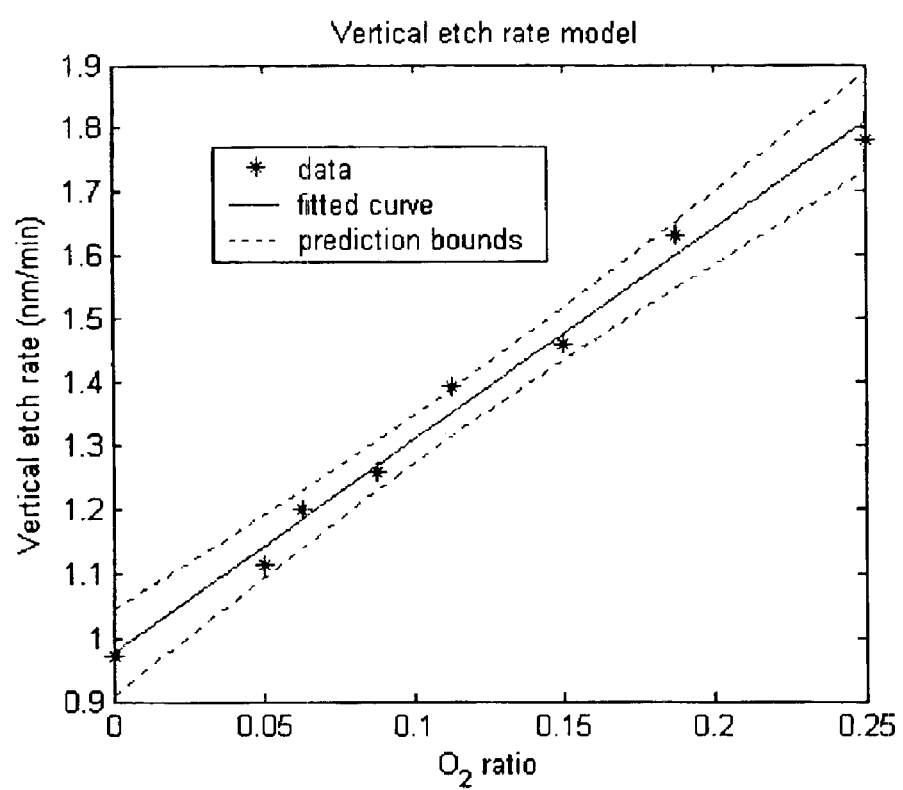
FIG. 7 shows etch rate data as a function of a gas ratio.

FIG. 7 presents the longitudinal (or vertical) etch rate as a function of the $O_2$ ratio. The longitudinal etch rate can be determined by taking the ratio of the known thickness of the first layer 14, and the time to reach endpoint when etching the first layer 14. The asterisks (*) represent the data, the solid line represents a curve fit (such as a polynomial fit, a power law fit, or an exponential fit) of the data, and the dashed lines indicate the predicted 95% confidence limits. The curve fit for the data of FIG. 7 is given by ER1 (etch rate)=3.328 x+0.976 (where x represents the abscissa data).

Figure 8:
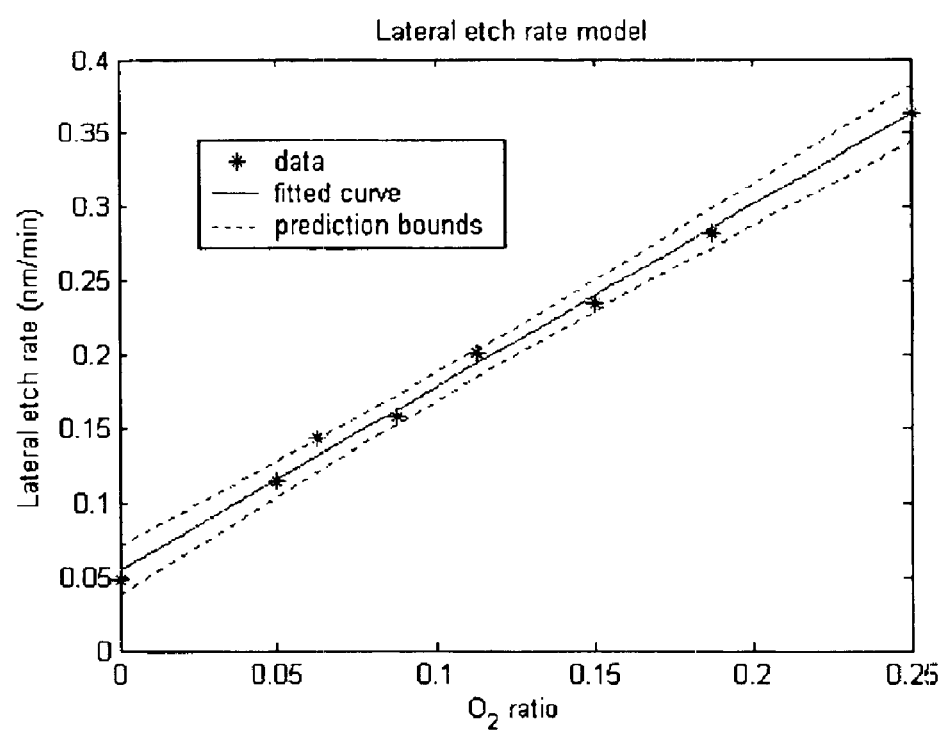
FIG. 8 shows additional etch rate data as a function of the gas ratio.

FIG. 8 presents the lateral etch rate as a function of the $O_2$ ratio. The longitudinal etch rate can be determined by taking the ratio of the measured trim amount, and the time to reach endpoint when etching the first layer 14. The asterisks (*) represent the data, the solid line represent a curve fit (such as a polynomial fit, a power law fit, or an exponential fit) of the data, and the dashed lines indicate the predicted 95% confidence limits. The curve fit for the data of FIG. 8 is given by ER2 (etch rate)=1.233 x+0.056.

Figure 9:
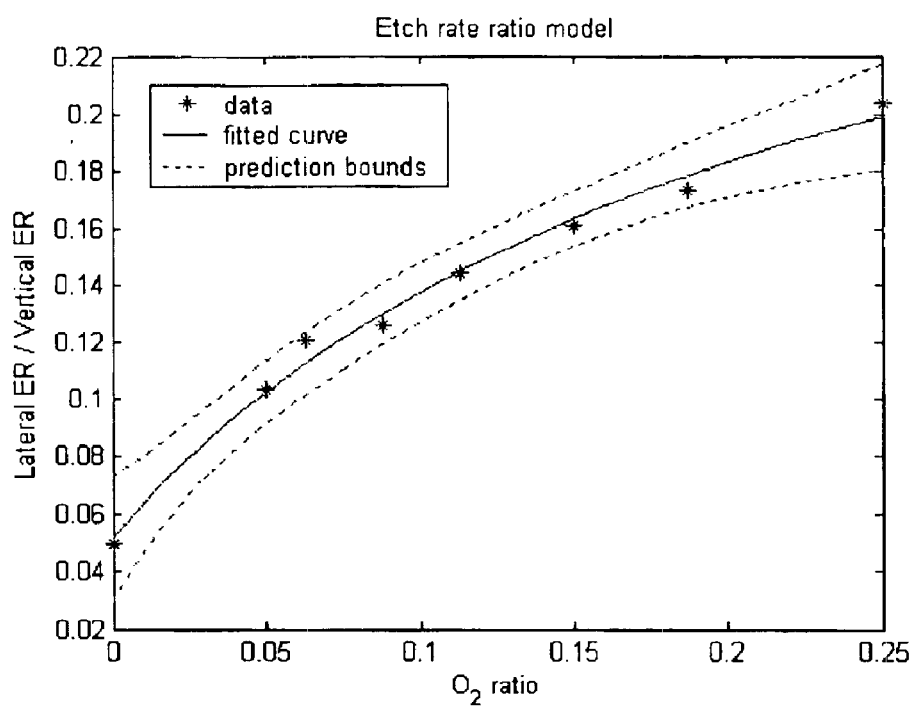
FIG. 9 shows a ratio of the etch rate data presented in FIGS. 7 and 8 as a function of the gas ratio.

FIG. 9 presents a ratio of the lateral etch rate to the longitudinal etch rate. The asterisks (*) represent the data (i.e., from raw data), the solid line represents a curve fit (such as a polynomial fit, a power law fit, or an exponential fit) of the data, and the dashed lines indicate the predicted 95% confidence limits. The curve fit for the data of FIG. 9 is given by ERR (etch rate ratio)=(x+0.035)/(2.999 x+0.685). The expression for the etch rate ratio from the curve fit of the longitudinal etch rate data (FIG. 7), and the lateral etch rate data (FIG. 8) is (x+0.044)/(2.699 x+0.791) (i.e., ERR~ER2/ER1).

Figure 10:
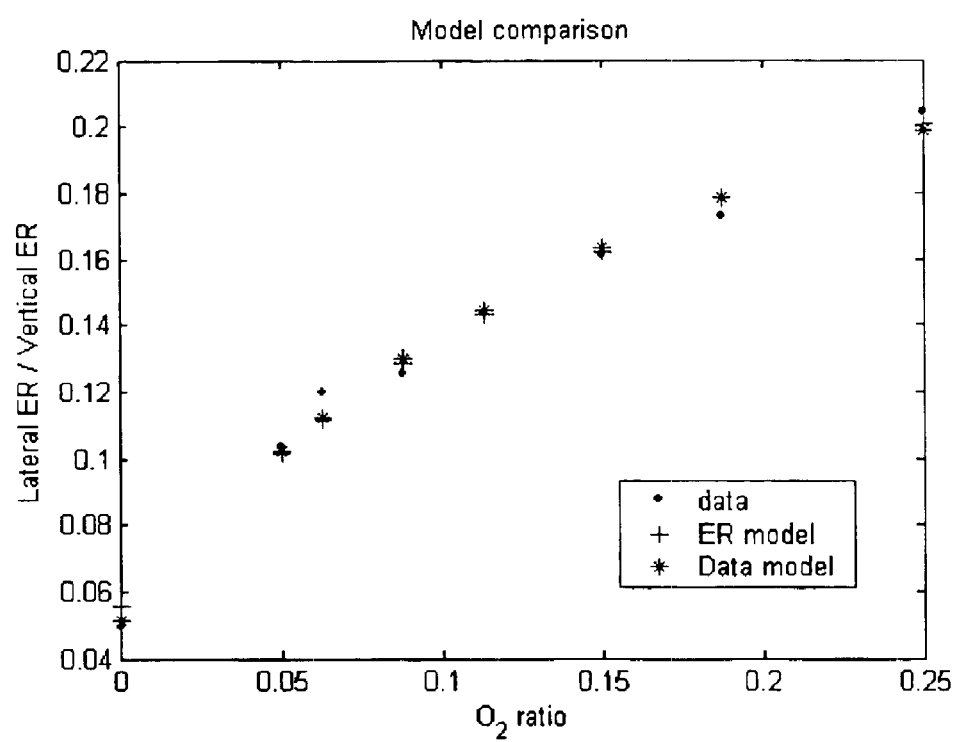
FIG. 10 presents the ratio of etch rate and two process models as a function of the gas ratio.

FIG. 10 presents the data of FIG. 9, including the raw data, the curve fit of the etch rate ratio (i.e., data model), and the ratio of the longitudinal and lateral etch rate curve fits (i.e., ER model).

Figure 12:
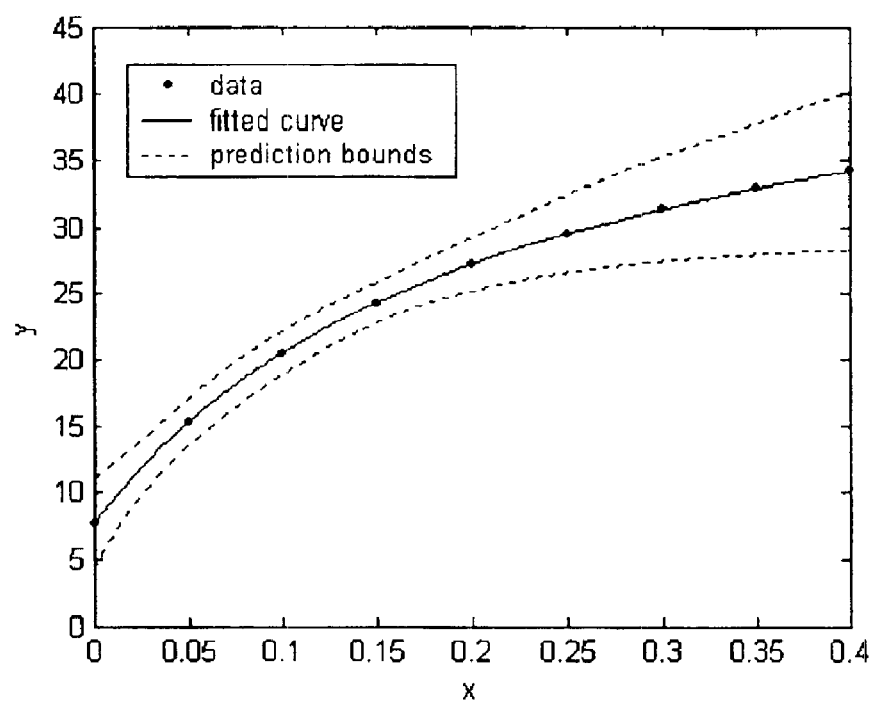
FIG. 12 presents a process model for relating the trim amount data to the gas ratio.

The trim amount (TA) during the one-step etch process (i.e., the difference between the first CD 22 and the second CD 28) can be given by the following expression $$TA = 2 \ OE \ ER_{lateral}(\tau/ER_{longitudinal}), \quad (1)$$

where OE represents the amount of overetch (e.g., OE=1.1 for a 10% overetch), $ER_{lateral}$ represents the lateral etch rate, $ER_{longitudinal}$ represents the longitudinal etch rate, and τ represents the thickness of the first layer 14. By inspection of equation (1), the trim amount (TA) is directly proportional to the etch rate ratio (ERR). Now referring to FIG. 11, the trim amount data is presented as a function of the $O_2$ ratio. The asterisks (*) represent the data (i.e., from raw data), the solid line represents a curve fit of the data, and the dashed lines indicate the predicted 95% confidence limits. The curve fit is of the form $$TA = (x+a)/(b \ x+c), \quad (2)$$

where a, b, and c are constants. As shown in FIG. 12, extrapolation of the process model outside of the original bounds of the model (e.g., 0.25<$O_2$ ratio<0.4) exhibits an improvement over polynomial fitting, for example. For instance, Table 1 illustrates the curve-fitting statistics for a second order polynomial expression, a third order polynomial expression, and an expression of the form in equation (2) (i.e., ER-based model). The curve-fitting statistics include the prediction $R^2$, the root mean square of the error (RSME), the maximum predicted error, the average predicted error, and the predicted RMSE.

Figure 13:
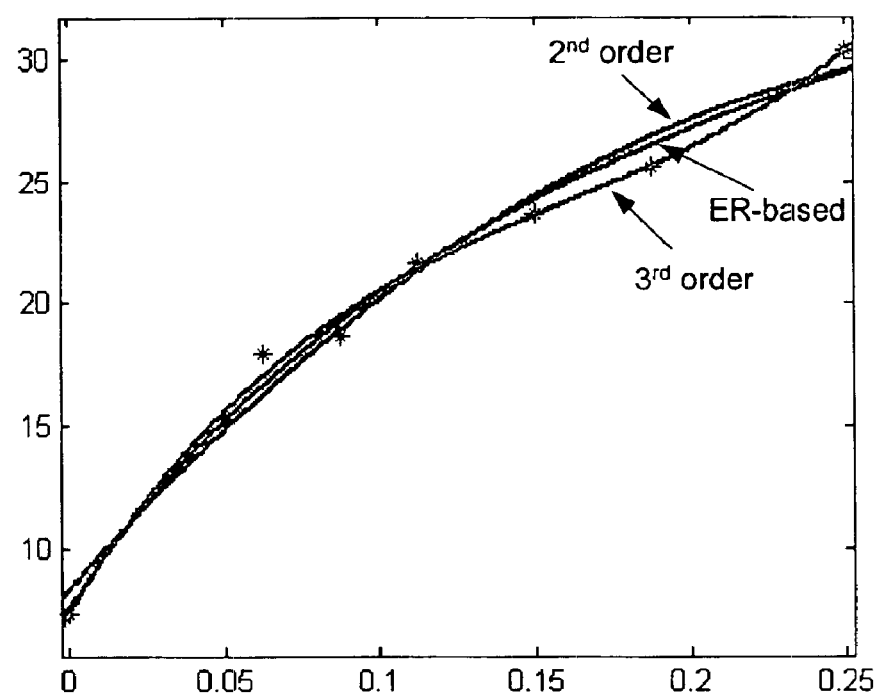
FIG. 13 compares the process model of FIG. 12 with a second order polynomial fit and a third order polynomial fit of the trim amount data.

As depicted in Table 1 and FIG. 13, the ER-based model compares well with the third order polynomial expression; however, it does not exhibit over-fitting as exhibited by the third order polynomial expression.

Figure 14:
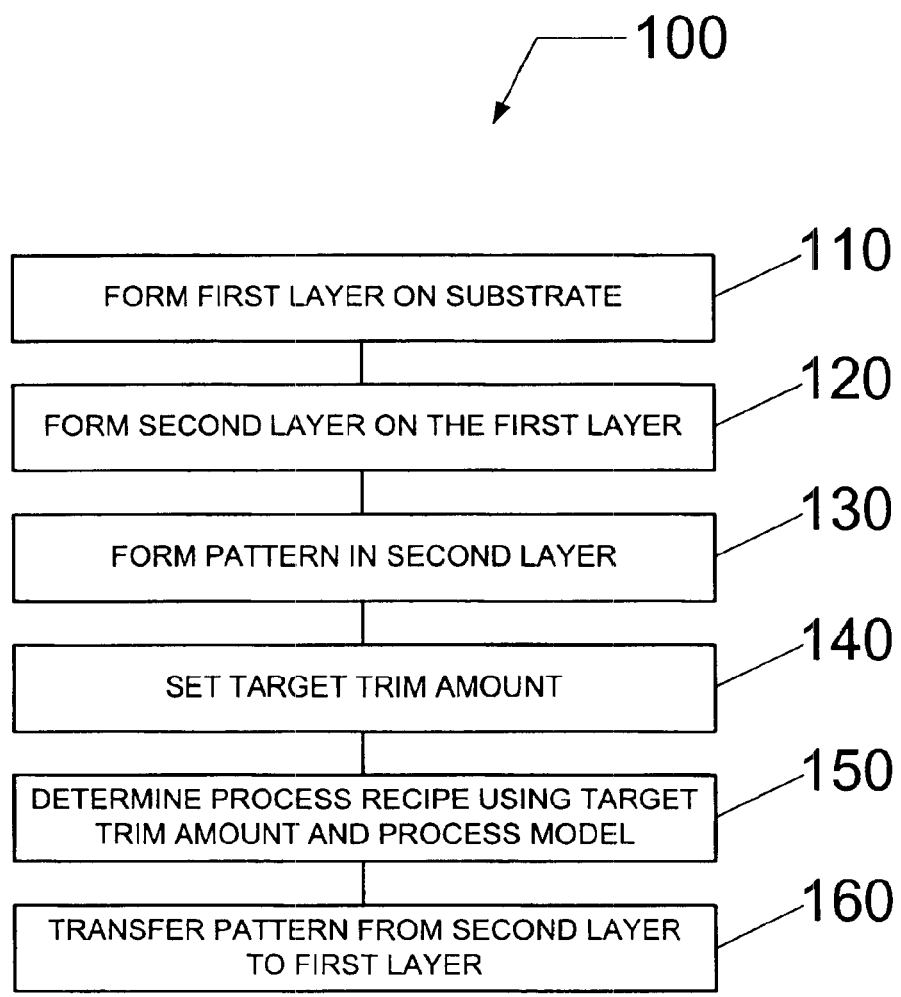
FIG. 14 illustrates a method of performing a one-step mask open process according to an embodiment of the invention.

FIG. 14 illustrates the method for performing a one-step etch process using a flow chart 100. Flow chart 100 begins in 110 with forming a first layer on a substrate. The first layer can, for example, include an organic layer.

TABLE 1

|  | Second-order model | Third-order model | ER-based model |
| --- | --- | --- | --- |
| R2 | 0.9802 | 0.9953 | 0.9888 |
| RMSE | 1.1641 | 0.6331 | 0.8752 |
| Max Pred. Err | 1.0988 | 0.7455 | 0.8987 |
| Avg. Pred. Err | 0.4972 | 0.4439 | 0.4023 |
| Pred. RMSE | 0.3812 | 0.2468 | 0.2369 |

In 120, a second layer is formed on the first layer. The second layer can, for example, include a layer of light-sensitive material. In 130, a pattern is formed in the second layer, wherein the pattern includes a feature in the second layer having a first critical dimension. The pattern can, for example, be formed using micro-lithography.

Figure 11:
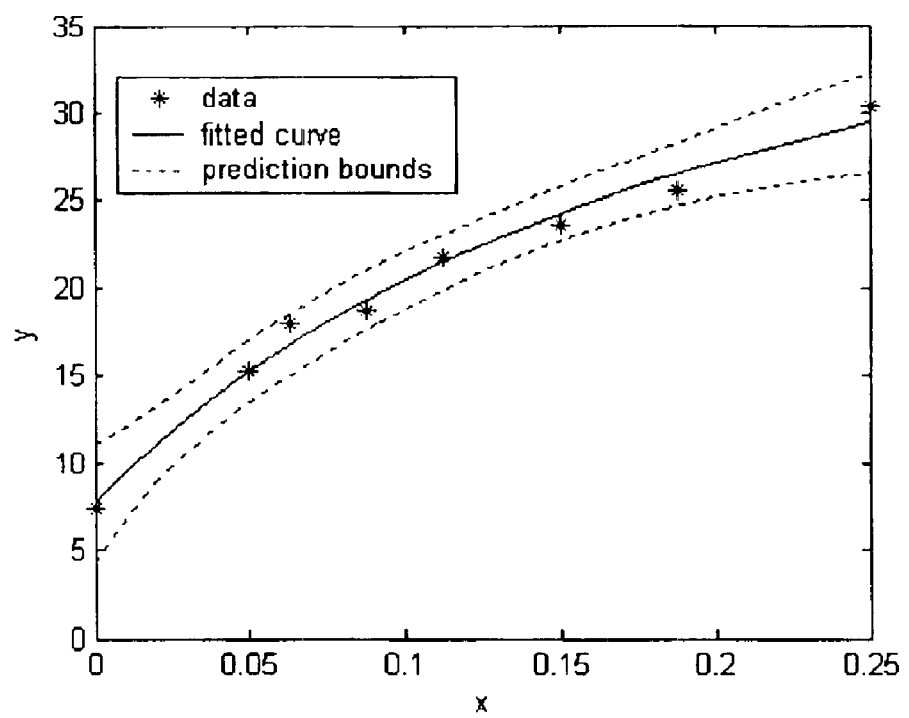
FIG. 11 presents trim amount data as a function of the gas ratio.

In 140, a target trim amount is set for trimming the first critical dimension to a second critical dimension. In 150, a variable parameter for a process recipe is determined using the target trim amount and a process model relating trim amount data with the variable parameter. For example, the variable parameter can include an amount of process gas, a chamber pressure, a RF power, a temperature, etc. Additionally, for example, the amount of gas can include a mass, a number of moles, a mass flow rate, a molar flow rate, a mass fraction, a mole fraction, a partial pressure, or a concentration. Additionally, for example, the process model can relate the trim amount with a mole fraction, as shown in FIGS. 11 through 13.

In 160, the pattern is transferred from the second layer (or overlying layer) into the first layer (or underlying layer) using an etch process according to the process recipe. While transferring the pattern into and through the first layer, the first critical dimension of the feature formed in the second layer is reduced to the second critical dimension as the feature is formed in the first layer.

In an alternate embodiment, following the transfer of the pattern into the first layer, the second critical dimension is measured, and a difference between the first critical dimension and the second critical dimension is determined. The difference is compared with the target trim amount, and an offset (or error) is determined from this comparison. Thereafter, when selecting a new target trim amount for another substrate, following the previously executed substrate, the new target trim amount is adjusted using the offset. For instance, the adjustment can utilize a filter, such as $$X_{new,a} = (1-\lambda)X_{new} + \lambda y, \quad (3)$$

where $X_{new,a}$ is the adjusted new target trim amount, $x_{new}$ is the new target trim amount, y is the offset, and $\lambda$ is the filter constant ($0 < \lambda < 1$).

Figure 15:
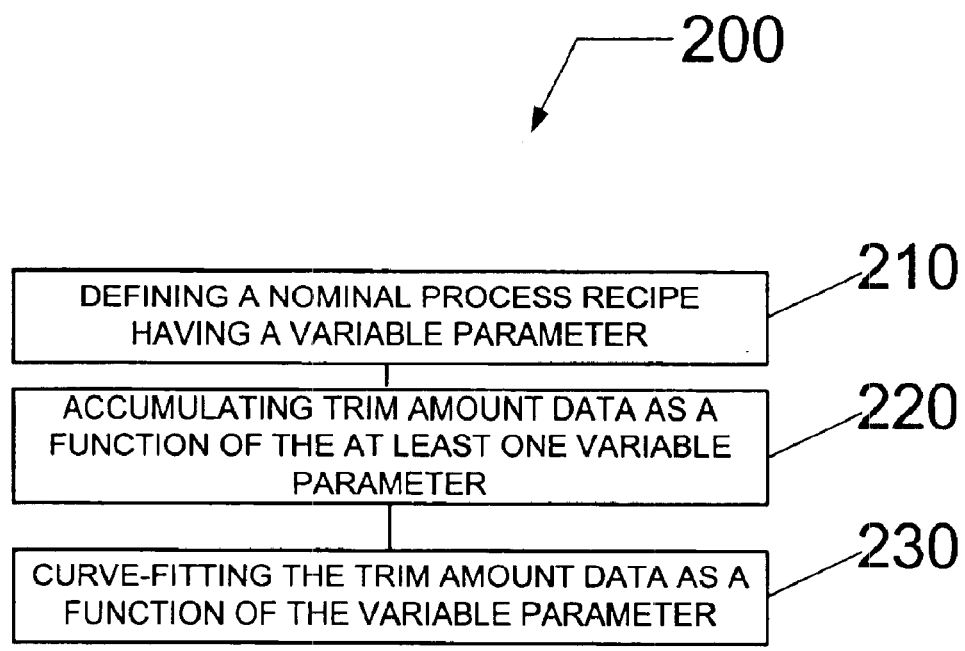
FIG. 15 illustrates a method of preparing a process-model according to an embodiment of the invention.

Now referring to FIG. 15, a method for preparing a process model is described. The method includes a flow chart 200 beginning in 210 with defining a nominal process recipe for transferring a pattern having a first feature size from an overlying layer to an underlying layer on a substrate, wherein the nominal process recipe comprises at least one variable parameter and at least one constant parameter.

In 220, trim amount data is accumulated as a function of the at least one variable parameter by measuring the trim amount for one or more values of the variable parameter. In 230, the trim amount data as a function of the variable parameter is curve-fit. For example, the curve-fit can include an expression of the form y=(x+a)/(bx+c), where a, b, and c are constants, x is the at least one variable parameter and y is the trim amount.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for performing a one-step mask open process comprising:

forming a first layer on a substrate;

forming a second layer on said first layer;

forming a pattern in said second layer, wherein said pattern includes a feature in said second layer having a first critical dimension;

setting a target trim amount for reducing said first critical dimension to a second critical dimension;

determining a variable parameter for a process recipe using said target trim amount and a process model relating trim amount data to said variable parameter; and transferring said pattern from said second layer to said first layer using said process recipe, while achieving said second critical dimension of said feature in said first layer.

2. The method of claim 1, wherein said setting said target trim amount includes determining a difference between said first critical dimension and said second critical dimension.

3. The method of claim 1, wherein said determining said variable parameter includes setting at an amount of a first process gas, an amount of a second process gas, a total amount of said first process gas and said second process gas, a chamber pressure, or at least one RF power, or any combination of two or more thereof.

4. The method of claim 3, wherein said determining said variable parameter includes setting a flow rate of $CF_4$, a flow rate of $O_2$, a chamber pressure, a RF power to an upper electrode, or a RF power to a lower electrode, or any combination of two or more thereof.

5. The method of claim 3, wherein said determining said variable parameter includes determining said amount of said first process gas from said process model, and determining said amount of said second process gas from said amount of said first process gas and said total amount of said first process gas and said second process gas.

6. The method of claim 1, wherein said determining said variable parameter includes using a process model relating trim amount data (y) to said variable parameter (x) of the form y=(x+a)/(bx+c), where a, b, and c are constants.

7. The method of claim 1, wherein said forming said first layer includes using a spin-on deposition and/or vapor deposition.

8. The method of claim 1, wherein said forming said first layer includes forming an organic layer.

9. The method of claim 1, wherein said forming said second layer includes using a spin-on deposition and/or vapor deposition.

10. The method of claim 1, wherein said forming said second layer includes forming a layer of light-sensitive material.

11. The method of claim 1, wherein said forming said pattern in said second layer includes using microlithography.

12. The method of claim 1, wherein said transferring said pattern from said second layer to said first layer includes using dry plasma etching according to said process recipe.

13. The method of claim 1, wherein said transferring said pattern from said second layer to said first layer is accomplished via longitudinal etching, and said achieving said second critical dimension from said first critical dimension is accomplished via lateral etching.

14. The method of claim 1, wherein said longitudinal etching and said lateral etching occurs simultaneously.

15. The method of claim 1, further comprising:

following said transfer of said pattern, measuring said second critical dimension of said second feature;

comparing said target trim amount with a difference between said first critical dimension and second critical dimension;

determining an offset from said comparison;

setting a new target trim amount for another substrate; and adjusting said new target trim amount using said offset.

16. The method of claim 15, wherein said adjusting said new trim amount includes using a filter.

17. The method of claim 16, wherein said using said filter includes using a filter of the form $x_{new,a} = (1-\lambda)x_{new} + \lambda y$, where $x_{new,a}$ is the adjusted new trim amount, $x_{new}$ is the new trim amount, $\lambda$ is a filter constant and y is an offset.

* * * * *